United States Patent [19]
Mathews

[11] Patent Number: 5,994,203
[45] Date of Patent: *Nov. 30, 1999

[54] PROCESS FOR STRESS REDUCTION IN SILICON DURING FIELD ISOLATION

[75] Inventor: Viju K. Mathews, Boise, Id.

[73] Assignee: Micron Technology, Inc., Boise, Id.

[ * ] Notice: This patent issued on a continued prosecution application filed under 37 CFR 1.53(d), and is subject to the twenty year patent term provisions of 35 U.S.C. 154(a)(2).

[21] Appl. No.: 08/607,946

[22] Filed: Feb. 28, 1996

[51] Int. Cl.$^6$ .................................................. H01L 21/76

[52] U.S. Cl. ..................... 438/448; 438/439; 438/297; 438/756

[58] Field of Search .................................. 437/69, 70, 72, 437/73; 438/439, 448, 297, 756

[56] References Cited

U.S. PATENT DOCUMENTS

| | | | |
|---|---|---|---|
| 5,134,089 | 7/1992 | Barden et al. | 437/69 |
| 5,358,892 | 10/1994 | Rolfson . | |
| 5,358,894 | 10/1994 | Fazan et al. . | |
| 5,447,885 | 9/1995 | Cho et al. | 437/69 |
| 5,506,440 | 4/1996 | Wei et al. | 437/69 |
| 5,523,255 | 6/1996 | Hyung et al. | 437/69 |
| 5,627,099 | 5/1997 | Sasaki | 437/72 |
| 5,631,189 | 5/1997 | Kobayashi | 437/69 |

FOREIGN PATENT DOCUMENTS

| | | |
|---|---|---|
| 0156839 | 7/1987 | Japan . |
| 302536 | 12/1988 | Japan . |
| 68930 | 3/1990 | Japan . |

OTHER PUBLICATIONS

Sung et al.; "The Impact of Poly–Removal Techniques on Thin Thermal Oxide Property in Poly–buffer LOCOS Technology"; IEEE Transactions on Electron Devices, vol. 38, No. 8, pp. 1970–1973, Aug. 1991.

H.S. Yang et al., "Poly–void Formation in Poly Buffer LOCOS Process," Extended Abstracts of the Spring Electrochem. Soc. Mtg. 1992, pp. 442–443.

T. Lin et al., "Twin–White–Ribbon Effect and Pit Formation Mechanism in PBLOCOS," J. Electrochemical Soc., Jul. 1991., pp. 2145–2149.

M. Ghezzo et al., "LOPOS: Advanced Device Isolation for an 0.8$\mu$m CMOS/BULK Process Technology," J. Electrochemical Soc., Jul. 1989, pp. 1992–1996.

R.L. Guldi et al., "Characterization of Poly–Buffered LOCOS in Manufacturing Environment," J. Electrochemical Soc., Dec. 1989, pp. 3815–3820.

S. Wolf, Silicon Processing for the VLSI Era, vol. 2, Lattice Press, Sunset Beach, CA, pp. 23–33.

*Primary Examiner*—Trung Dang
*Attorney, Agent, or Firm*—Knobbe, Martens, Olson & Bear, LLP

[57] ABSTRACT

A new polysilicon-buffered field isolation process provides reduced stress during field oxidation and reduced bird's beak. Prior to forming the LOCOS masking stack conventionally used for field isolation, a polysilicon buffer layer is first formed on the semiconductor wafer. The polysilicon buffer layer relieves stress between the masking stack and semiconductor wafer similar to conventional Poly-buffered LOCOS processes, but additionally provides sacrificial silicon into which the bird's beak region extends. Subsequent deprocessing of mask and buffer layers removes a significant portion of the bird's beak region, thereby providing active areas having improved physical and electrical characteristics.

26 Claims, 3 Drawing Sheets

PROCESS FOR STRESS REDUCTION IN SILICON DURING FIELD ISOLATION

BACKGROUND OF THE INVENTION

1. Field of the Invention

The invention relates generally to semiconductor integrated device design and fabrication and more particularly, to techniques for reducing stress induced charge leakage in VLSI memory arrays such as dynamic random access memories (DRAM).

2. Description of the Related Art

This invention relates to manufacturing processes used to create multilayer semiconductor circuit devices on silicon substrates such as VLSI and ULSI. Generally, these processes include isolation processes, which isolate the active areas of the semiconductor from each other and device implantation processes which result in devices such as transistors and the like being implanted into the active areas. These processes are used to produce, among other things, items such as memory cells. In the past several years the trend has been to produce chips having a higher density of active devices. In particular, DRAM memories are but one example of devices made with these manufacturing processes that have necessitated smaller dimension devices.

As the dimensions of individual memory cells in a DRAM array continue to shrink, the need for efficient and reliable isolation processes to separate active device regions dramatically increases. In fact, known processing techniques have become increasingly ineffective for memory cells and other devices having sub-micron dimensions. Specifically, to extend the use of LOCOS (for LOCal Oxidation of Silicon) isolation technology into sub-half-micron size for 256M DRAM generation, radical modifications in conventional processing technologies are needed.

LOCOS processing is widely used for device isolation applications in the semiconductor industry. Initially, in a conventional LOCOS process, a thin layer of silicon dioxide ($SiO_2$) is grown on a silicon substrate. This initial layer of silicon dioxide is known as pad oxide in the LOCOS process. The function of this layer is to reduce stress between the silicon substrate and the subsequently deposited layers. Next, a layer of nitride is deposited on the pad oxide layer and lithographically defined to retain the nitride in the active device regions. The nitride is etched from the area between the active device areas where a thick, isolating silicon dioxide layer (field oxide) is to be grown. After the nitride is defined on top of the future active device areas, an oxide layer is thermally grown in the exposed silicon regions and the nitride acts essentially as an oxidation barrier to prevent most oxide growth in the active regions. During the process of oxidation, however, some of the oxidants diffuse laterally at the edges of the nitride masking stack. This causes the oxide layer to grow under and lift the edges of the nitride masking stack. The region of slowly tapering oxide that encroaches under the nitride stack into the active device areas is generally known as the bird's beak region, due to its shape.

Unfortunately, there are several problems that arise from this oxide encroachment under the nitride stack into the active device areas. First, the bird's beak region limits the usable active device areas in the active device region of the substrate. Second, the stress originating from this encroachment and the masking stack thickness increase the overall stress level which leads to the generation of defects in the silicon substrate. These stress induced defects increase the junction leakage current and, as such, reduce the overall reliability of the device.

The problems of the standard LOCOS process have motivated the development of better isolation schemes. In general, an ideal isolation technique should meet the following requirements. First, the spacing between active areas, e.g., the isolation regions, should be minimal to maximize the active area regions of the wafer. Second, the bird's beak region should be as small as possible. Third, the leakage current between active devices must be negligible. Fourth, the process for forming the isolation should not adversely affect the process parameters required for active device fabrication. Finally, the isolation process should be easy to implement and control.

Among a few other isolation technologies, which have focussed their effort on reducing the length of the bird's beak region, the Poly Buffered LOCOS (PBL) isolation process has demonstrated itself as a less complicated improvement on the conventional LOCOS process. PBL uses a polysilicon (poly) layer between the pad oxide and the nitride prior to field oxide growth. The presence of the intermediate polysilicon layer allows the oxide to be thinned and the nitride thickened without generating undue stress in the active regions in order to reduce encroachment during the field oxidation step. In general, a thinner pad oxide layer allows less oxide encroachment under the nitride stack because the downward compressing force from the nitride stack is transmitted more effectively to the substrate through a thinner oxide layer. Consequently, an approximate 50% reduction in length of bird's beak region can be achieved. Following the growth of field oxide the nitride masking stack layers are sequentially stripped (etched away) from the active area locations.

Unfortunately, in standard poly buffered LOCOS processing, the stripping process causes pitting on the surface of the substrate. During the stripping step of the polysilicon layer, the etchants used for stripping polysilicon penetrate into the substrate through the underlying pad oxide layer and develop cavities, i.e., pits, on the surface of the substrate. This cavity formation makes the active areas less usable for further device applications. The pitting becomes more severe as the active area dimensions are reduced to the submicron size.

It is believed that this particular problem with PBL initially begins with the diffusion of oxidants and ammonia along the masking stack layers, which are nitride, polysilicon and pad oxide on top of a silicon substrate, during field oxidation. The oxidants and ammonia diffusing along the pad oxide and polysilicon layers react with the surface of substrate and the top and bottom surfaces of the polysilicon layer to form silicon dioxide and nitride spots thereon. The oxidation and nitridation which proceed along the polysilicon grain boundaries result in some grain boundaries that are more nitride-like in characteristics and others more oxide-like. Hence, when the nitride layer is etched off, nitridized polysilicon grains are completely removed, thereby leaving pits on the polysilicon layer.

Further, during the removal of silicon dioxide residues from the top of the polysilicon layer, oxide etchant penetrates the underlying pad oxide layer through the pitted regions and etches the underlying pad oxide region thereby partially exposing the substrate. Consequently, during the etching step of the polysilicon layer, the polysilicon etchants attack these exposed regions of the substrate. This "pitting" phenomenon is further discussed in "Twin-White-Ribbon Effect and Pit formation Mechanism in PBLOCOS", by Tin-hwang Lin, et al., J. Electr. Chem. Soc., Vol. 138, No. 7, July 1991, pp. 2145–2149.

Techniques to alleviate the problems associated with PBL increase the complexity of the prior art PBL process and thereby increase the costs associated with manufacturing devices using the PBL process. Thus, there is a need to develop new processing techniques to reduce the length of bird's beak region encroachment into the active areas and the related defects while minimizing damage to the upper surface of the active device regions of the wafer during processing.

SUMMARY OF THE INVENTION

By means of a significant modification to the PBL poly buffered LOCOS process, the process of the current invention satisfies the aforementioned needs.

As a departure from the conventional PBL technique, the method of the present invention employs a polysilicon layer between the silicon substrate and the field oxidation masking stack. During the field oxide growth, this polysilicon layer acts as a buffer and absorbs the stress associated with the encroaching field oxide and the stiffness of the masking stack, thus minimizing the stress induced defects in the substrate. Further, the polysilicon layer eliminates damage to the substrate during the nitride definition etch and damage to the active areas during the stripping of masking stack layers. The process proceeds with the removal of remaining polysilicon by a sacrificial oxide growth step which results in larger active areas incorporated with reduced oxide encroachment.

In one embodiment, the process begins with the deposition of a polysilicon layer on a silicon wafer, followed by the formation of a masking stack on top of the polysilicon layer. The masking stack comprises a pad oxide layer and a nitride layer deposited thereon. Next, the masking stack is patterned and etched selectively in order to remove portions of the nitride layer and the pad oxide layer in unmasked regions, while preserving the polysilicon layer on top of the substrate as an etch-stop layer to prevent substrate damage. The exposed regions of the polysilicon layer are then oxidized to form field oxide isolation regions which also encroach under the masking stack and partially consume the polysilicon therein.

The masking stack is then removed and it will be appreciated that, during subsequent stripping of the masking stack layers, the underlying unoxidized polysilicon portions act as an etch-stop to prevent damage to active areas. Subsequently, the wafer is oxidized to grow a sacrificial oxide layer that totally consumes the remaining polysilicon on the wafer. This sacrificial oxide layer is then stripped off to expose the defined active areas and isolation regions. It will be appreciated that the oxide encroachment of the isolation regions into the active area is reduced and the active areas are larger as a consequence of the stripping of the sacrificial oxide layer. It will be further appreciated that the present process greatly reduces stress induced defect formation during the isolating field oxide growth and also reduces active area damage during the masking stack stripping process.

These and other objects and futures of the present invention will become more fully apparent from the following description with reference to the accompanying drawings.

DETAILED DESCRIPTION OF THE PREFERRED EMBODIMENT

Reference will now be made to the drawings wherein like numerals refer to like parts throughout.

Figure 1A:
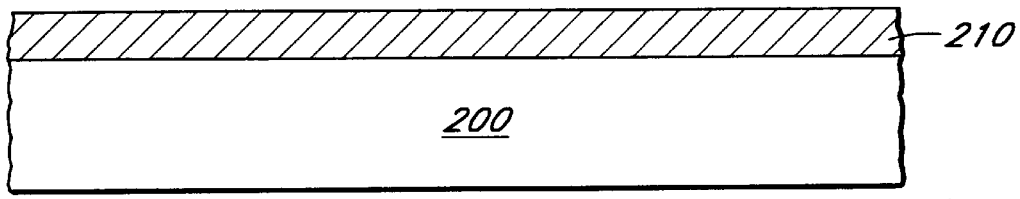
FIG. 1A is a schematic section of a silicon wafer having a polysilicon layer deposited on the top side.

FIG. 1A illustrates a substrate 200 of a semiconductor material that has a first layer 210 of a semiconductor material formed thereon. In the preferred embodiment, the substrate 200 comprises a silicon wafer and the first layer of semiconductor material 210 is comprised of a layer of polysilicon. The polysilicon layer 210 can be deposited on the silicon wafer 200 using any of a number of well-known techniques, and in the preferred embodiment is deposited using the LPCVD (Low Pressure Chemical Vapor Deposition) method at approximately 625° C. with a thickness of approximately 200 Å. It will be understood from the following description that the deposition of the polysilicon 210 layer as an initial processing step for the silicon wafer 200, as opposed to the standard pad oxide growth on the silicon wafer performed in prior art processing techniques, provides a combination of etch-stop and stress-relief characteristics for further processing steps.

Figure 1B:
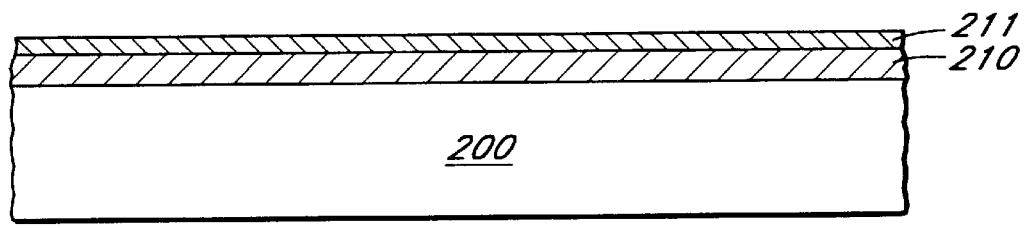
FIG. 1B is a schematic view of the wafer shown in FIG. 1A wherein a layer of pad oxide has been grown on top of the polysilicon layer on the top surface of the wafer.

FIG. 1B illustrates that, following the deposition of the polysilicon layer 210 on the wafer 200, a pad oxide layer 211 is formed on top of the polysilicon layer 210. In the preferred embodiment, the polysilicon layer 210 is oxidized at approximately 800° C. to produce the layer of pad oxide 211 and the thickness of the pad oxide layer 211 is approximately 60 Å. As is understood in the art, this thin pad oxide layer 211 serves as a protective transition layer to reduce possible stresses between the polysilicon layer 210 and a subsequently deposited layer.

Figure 1C:
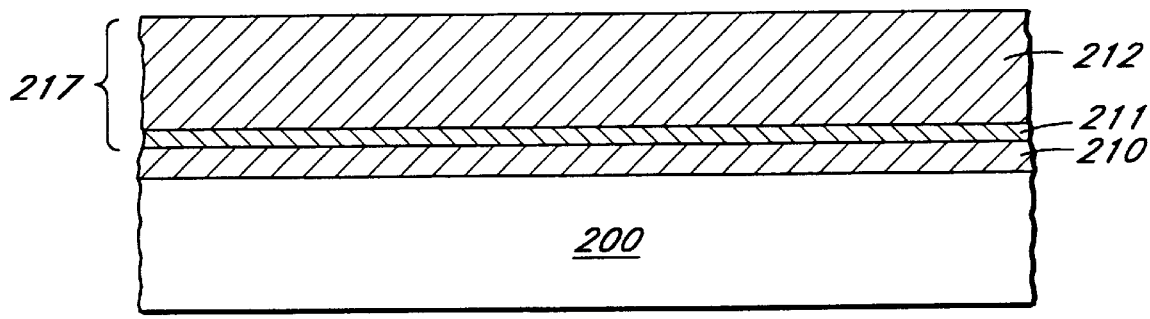
FIG. 1C is a schematic view of the wafer shown in FIG. 1B wherein a silicon nitride layer has been deposited on the top of the polysilicon layer.

FIG. 1C illustrates that, subsequent to the growth of the pad oxide layer 211, a layer of oxidation masking material 212, which forms part of an oxidation mask 217 for the formation of the field oxide isolation regions in the substrate 200, is deposited on the pad oxide layer 211. In the preferred embodiment, the mask layer 212 comprises a layer of silicon nitride (nitride) that is deposited using preferably the LPCVD method at approximately 800° C. with a thickness of approximately 1500 Å–2500 Å. It will be understood that a thick nitride layer 212 substantially reduces field oxide encroachment into the active areas during the growth of the field oxide isolation regions in the semiconductor substrate 200. Further, by forming the nitride layer 212 on the composite structure of the polysilicon layer 210 and the pad oxide layers 211, stress induced defects in the substrate 200 generated from this nitride layer 212 are prevented.

Figure 1D:
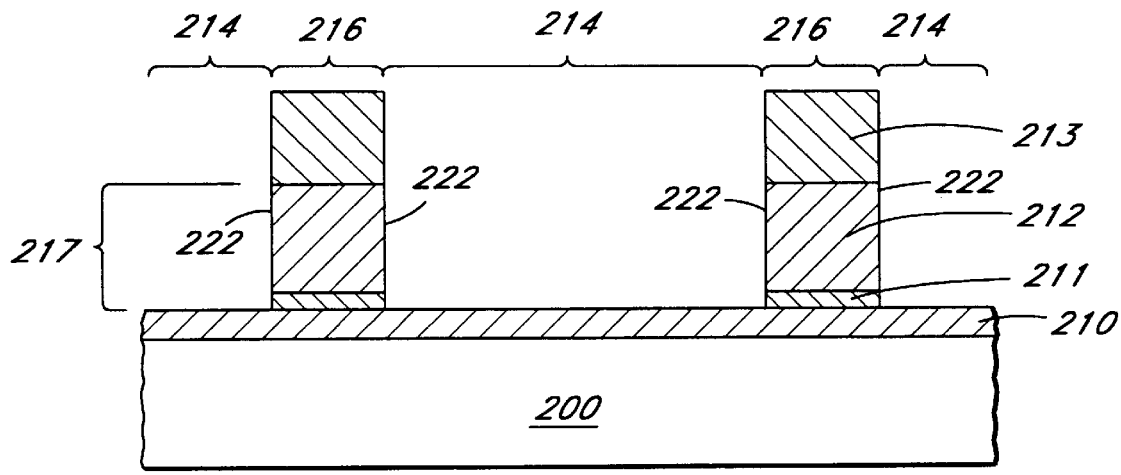
FIG. 1D is a schematic view of the wafer shown in FIG. 1C wherein a photoresist has been deposited on top of the nitride masking stack on the top of the wafer, and the masking stack has been patterned and etched to expose field oxide regions.

As illustrated in FIG. 1D, a layer of photoresist material 213 is then formed on top of the oxidation masking stack 217 and it is then patterned and etched using conventional lithography techniques, or other suitable techniques known in the art, to expose the polysilicon layer 210 in opening 214. The nitride layer 212 and the pad oxide layer 211 are each preferably etched separately using etching agents that provide a strong vertical profile for the openings 214. Preferably, an anisotropic etch is used which results in the side walls 222 of the opening 214 being substantially normal to the upper surface of the substrate 200. Further, the etching agent used to etch the pad oxide layer 211 is selected so that the etching reaction preferably stops at the upper surface of the polysilicon layer 210 thereby preventing damage to the underlying substrate 200. The remaining photoresist layers 213 can then be removed using any of a number of well known methods including application of a heated mixture of sulfuric acid ($H_2SO_4$) and hydrogen peroxide ($H_2O_2$).

Figure 1E:
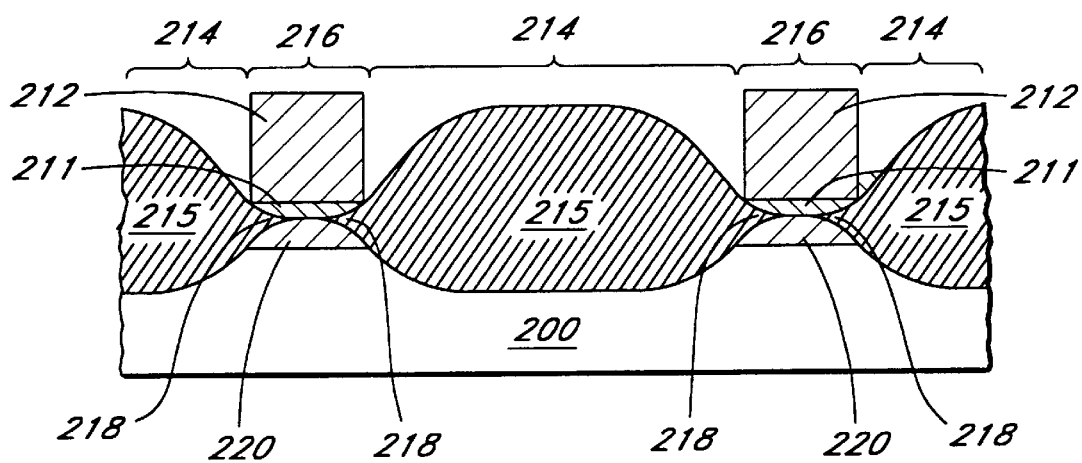
FIG. 1E is a schematic view of the wafer shown in FIG. 1D wherein field oxide isolation regions have been grown into the wafer.

FIG. 1E illustrates that a field oxide isolation region 215 is then grown on the exposed areas of the polysilicon layer 210 and the underlying substrate 200 in the openings 214, i.e., the areas of the polysilicon layer 210 and the substrate not covered by the oxidation masking stack 217. The field oxidation regions 215 are preferably formed by an oxidation process in a wet or steam ambient at approximately 1000° C. with a preferred thickness of approximately 1500 Å–4000 Å. During the field oxidation process, the polysilicon layer 210 acts as a buffer and absorbs the stresses generated in the silicon substrate 200 by the growth of the field oxide regions 215. While the growth of field oxide regions 215 consumes the buffer poly silicon 210 in the openings 214, there is a region of field oxide encroachment 218, known as a bird's beak encroachment region 218, which occurs that also partially consumes the polysilicon layer 210 under the masking stack 217. As a result of this, the bird's beak encroachment region 218 stays appreciably within the limits of the polysilicon layer 210 thereby reducing the number of stress induced defects in the underlying active areas of the substrate 200.

Figure 1F:
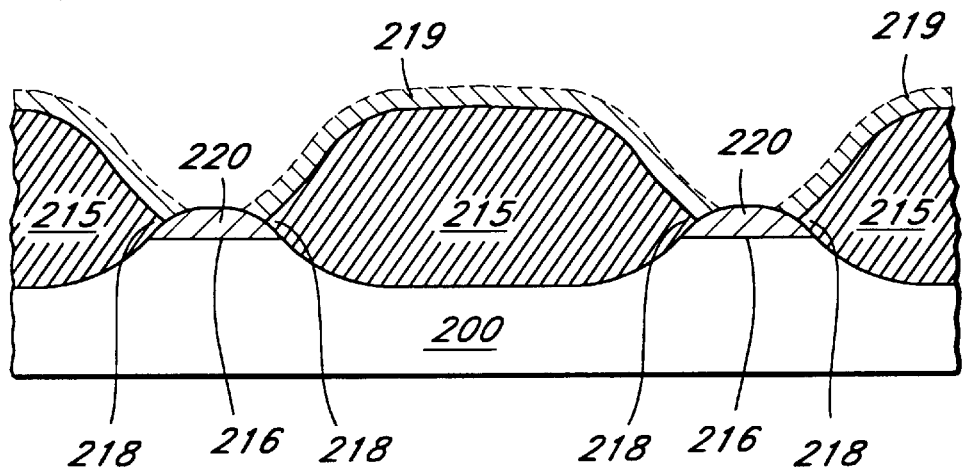
FIG. 1F is a schematic view of the wafer shown in FIG. 1E wherein the masking stack layers have been stripped from the wafer.

As illustrated in FIG. 1F, after the growth of the field oxide isolation regions, the remaining nitride 212 and the pad oxide layer 211 are sequentially removed from the substrate 200. The removal of these layers can be done in a dry plasma environment or by use of sequential wet etchants. In the preferred embodiment, any oxide layer (not shown) which has formed on top of the nitride 212 layer, commonly referred to as a cap oxide, is initially stripped with a buffered oxide etch (BOE) at an approximate temperature of 30° C. The nitride layer 212 is then stripped in hot phosphoric acid ($H_3PO_4$) at an approximate temperature of 150° C. Finally, the pad oxide layer 211 and portions of the polysilicon layer 210, where the bird's beak region has horizontally encroached under the nitride masking stack 217 are stripped in an HF ambient.

It will be appreciated that since the polysilicon layer 210 is positioned between the substrate 200 and the pad oxide layer 211, pitting defects forming as a result of the polysilicon etch step of the prior art processing is completely eliminated.

Further referring to FIG. 1F, after the completion of the removal of the pad oxide layer 211, there are a plurality of residue islands 220 of the polysilicon material 210 that remain between the edges of field oxide isolation regions 215. These islands 220 are simply the regions of the polysilicon layer 210 underneath the nitride masking stack 217 that was not oxidized during the growth of the field oxide isolation regions 215. It will be appreciated that the stripping processes described above remove the pad oxide layer 211 and portions of the field oxide isolation regions 215 including portions of the bird's beak encroachment region 218.

It will be appreciated that when the pad oxide layer 211 is etched along with a portion 219 of the field oxide isolation regions 215, the polysilicon islands 220 act as an etch stop and protect the active regions 216 from damage during the etching process. Specifically, it will be appreciated that if the etchant etches through the birds beak region 218 it will not reach the active region 216 of the substrate 200 due to the presence of the polysilicon islands 220. Hence, the islands 220 protect the active region 216 from pitting.

It will also be appreciated from reference to FIG. 1F that the field oxide isolation regions 215 are exposed during the etching processes. Hence, during the cap oxide etch and the pad oxide etch, the center section of the field oxide isolation region 215 is also etched. This results in a smoother, more planar surface of the field oxide isolation regions 215. It will be appreciated that this makes the upper surface of the wafer more suitable for sub-micron applications.

Figure 1G:
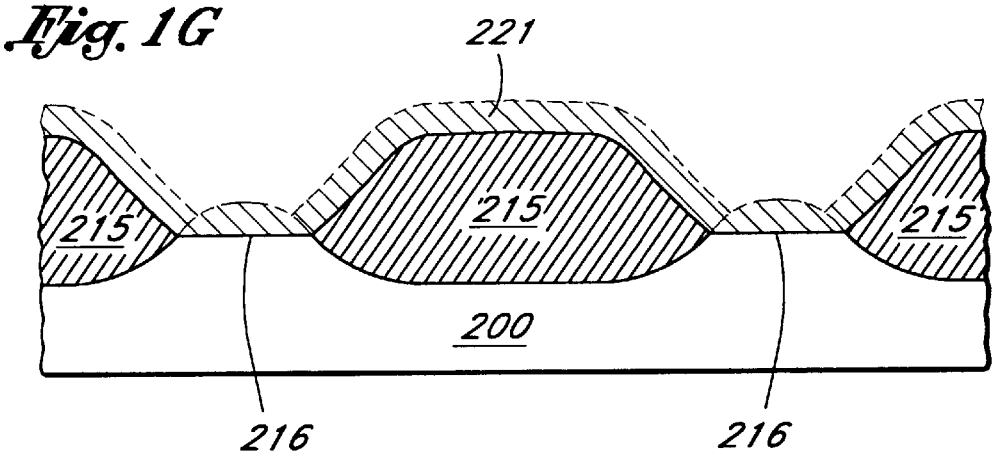
FIG. 1G is a schematic view of the wafer shown in FIG. 1F wherein a sacrificial oxide layer has been grown on top of the wafer.

FIG. 1G illustrates that, following the removal of the masking stack 217, a thin silicon dioxide layer 221 is grown on the substrate 200. The layer of silicon dioxide 221 is known as a sacrificial oxide layer. In the preferred embodiment the growth of the sacrificial oxide layer 221 is carried out in a wet or steam ambient at an approximate temperature of 1000° C. As is understood in the art, the sacrificial oxide layer 221 serves to remove the remaining islands 220 of the polysilicon layer 210 from top of the active area regions 216 as the polysilicon islands 220 are oxidized to form the sacrificial oxide layer 221 in those regions.

Figure 1H:
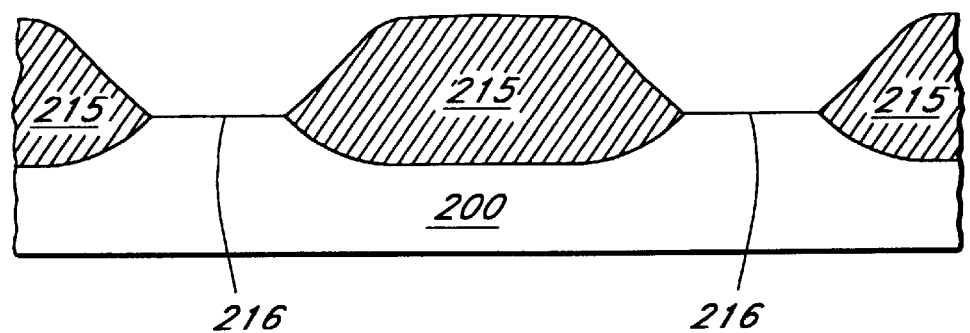
FIG. 1H is a schematic view of the wafer shown in FIG. 1G wherein the sacrificial oxide on the top of the wafer has been stripped.

Subsequently, as illustrated FIG. 1H, the sacrificial oxide layer 221 is removed resulting in a steeper profile for the field isolation region 215 profile, i.e., the horizontal bird's beak encroachment 218 into the active areas 216 is reduced and the oxide-to-silicon isolation boundary has a more vertical profile. Further, etching of the sacrificial oxide also results in a nearly planar surface topography. The preferred embodiment uses HF to etch off the sacrificial oxide layer 221, this etching of the sacrificial oxide 221 results in an equal thickness of the top of the field oxide regions 215 being etched away which, in turn, results in a larger active area 216 as is illustrated by comparing FIG. 1G and 1H. Gate oxide growth and the rest of the manufacturing flow is proceeded by the normal process steps.

It will be understood that the process of the preferred embodiment uses a thin polysilicon 210 layer between the silicon substrate 200 and the field oxidation masking stack 217. The location and use of the polysilicon layer 210 results in less stress and stress induced defects in the substrate 200 during the field oxide 215 growth as the stress is absorbed by the buffer layer of polysilicon 210, as opposed to the substrate 200, and the buffer layer 210 is subsequently removed. Further, the problems associated with a poly buffered LOCOS-type process, such as damage to the active areas 216 during the stripping of nitride masking stack 217 or damage to the substrate during the nitride definition etch, is also reduced due to the presence of the polysilicon layer at the top of the substrate. The difference in etch chemistries for nitride 212, silicon dioxide 211 and polysilicon 210 allows for these regions to be selectively etched resulting in a straight, i.e., substantially vertical, masking stack 217 profile. Subsequently, this polysilicon layer 210 is consumed and removed and the wafer then has defined active regions and isolation regions, wherein the birds beak encroachment of the isolation regions is reduced and the active regions are larger.

Although the foregoing description of the preferred embodiment of the present invention has shown, described and pointed out the fundamental novel features of the invention, it will be understood that various omissions, substitutions, and changes in the form of the detail of the apparatus as illustrated as well as the uses thereof, may be made by those skilled in the art, without departing from the spirit of the present invention. Consequently, the scope of the present invention should not be limited to foregoing discussions, but should be defined by the appended claims.

What is claimed is:

1. A process for producing a semiconductor wafer having isolation regions comprising the steps of:

forming a polysilicon buffer layer directly on a first surface of said semiconductor wafer;

forming a masking stack on top of said polysilicon buffer layer by depositing a pad oxide layer on said polysilicon buffer layer and depositing a masking material on said pad oxide layer;

selectively removing a portion of said masking stack to expose a selected region of said polysilicon buffer layer;

forming an isolation region of an isolation material in said selected region of said polysilicon buffer layer wherein said isolation region extends into said semiconductor wafer and wherein said formation of said isolation region transforms said selected region of said polysilicon buffer layer into said isolation material; and removing the remaining portions of said polysilicon buffer layer by transforming said remaining portions into said isolation material and subsequently etching said transformed portions of said buffer layer.

2. The method of claim 1, wherein the step of forming a masking stack on top of said buffer layer comprises the steps of:

forming a pad oxide layer on top of said polysilicon layer; and forming a nitride layer on top of said pad oxide layer.

3. The method of claim 2, wherein the step of selectively removing a portion of said masking stack to expose a selected region of said buffer layer comprises patterning and etching said nitride layer and said pad oxide layer to expose said polysilicon layer.

4. The method of claim 3, wherein the step of forming an isolation region comprises growing a field oxide, said field oxide having a bird's beak region extending into said polysilicon buffer layer.

5. The method of claim 4, further comprising the step of removing a portion of said polysilicon buffer layer to expose an active area of said semiconductor wafer.

6. The method of claim 5, wherein the step of removing a portion of said polysilicon buffer layer comprises:

removing a remaining portion of said masking stack to expose said field oxide isolation region and a remaining portion of said polysilicon buffer layer;

oxidizing the remaining portion of said polysilicon buffer layer; and etching said oxidized portion of polysilicon buffer layer to expose said active region, wherein a portion of said bird's beak of said field oxide isolation region is removed.

7. The method of claim 1, wherein the isolation region includes a bird's beak region and when said isolation region is formed in said buffer layer, at least a portion of said birds beak region extends into said buffer layer.

8. The method of claim 7, further comprising the step of removing the buffer layer that contains at least a portion of said bird's beak region of said isolation region to expose an active area of said semiconductor.

9. A method of reducing stress in a field oxide isolation process comprising:

providing a silicon wafer having a first side;

forming a polysilicon buffer layer directly on a first surface of a semiconductor wafer;

forming a masking stack on said buffer layer by depositing a pad oxide layer on said polysilicon buffer layer and depositing a masking material on said pad oxide layer;

selectively removing a portion of said masking stack to expose a selected region of said polysilicon buffer layer;

forming an isolation region of an isolation material in said polysilicon buffer layer wherein said isolation region extends into said semiconductor wafer and wherein said formation of said isolation region transforms said selected region of said polysilicon buffer layer into said isolation material; and removing remaining portions of said polysilicon buffer layer by transforming said remaining portion into said isolation material and subsequently etching said transformed portions of said buffer layer.

10. The method of claim 9, wherein said step of forming a masking stack on said polysilicon buffer layer comprises the steps of:

forming a pad oxide layer on said polysilicon buffer layer; and forming a nitride layer on said pad oxide layer.

11. The method of claim 10, wherein said step of selectively removing a portion of said masking stack comprises patterning and etching said nitride layer and said pad oxide layer to expose said polysilicon buffer layer.

12. The method of claim 11, wherein said step of forming an isolation region comprises growing a field oxide in said polysilicon buffer layer, said field oxide having a bird's beak region extending into said polysilicon buffer layer.

13. The method of claim 12, wherein said step of forming an isolation region produces stress on said semiconductor wafer, and wherein said polysilicon buffer layer formed on said semiconductor wafer reduces said stress.

14. The method of claim 13, wherein said reduction of stress in said semiconductor wafer reduces junction leakage currents in active areas formed on said semiconductor wafer.

15. A process for producing a semiconductor wafer having isolation regions therein comprising the steps of:

forming a buffer layer of a polysilicon material directly on a first surface of a semiconductor wafer;

forming a masking stack on said buffer layer by depositing a pad oxide layer on the buffer layer and a masking material on said pad oxide layer;

selectively removing a portion of said masking stack to expose a selected region of said buffer layer;

forming an isolation region of a second material in said selected region of said buffer layer wherein said isolation region extends into said semiconductor wafer and wherein said formation of said isolation region transforms said selected region of said buffer layer into said second material thereby creating an isolated island of said first material;

transforming said island of first material into said second material; and removing a portion of said second material to expose an active area of said substrate.

16. The method of claim 15, wherein said step of forming a masking stack on said buffer layer comprises the steps of:

forming a pad oxide layer on said polysilicon layer; and forming a nitride layer on said pad oxide layer.

17. The method of claim 16, wherein said step of selectively removing a portion of said masking stack comprises patterning and etching said nitride layer and said pad oxide layer.

18. The method of claim 17, wherein said step of selectively removing a portion of said masking stack comprises etching a portion of said silicon nitride layer and said pad oxide layer, and wherein said polysilicon buffer layer prevents etching of said semiconductor substrate.

19. The method of claim 18, wherein said step of forming an isolation region comprises growing a field oxide in said selected regions of said polysilicon buffer layer resulting in said polysilicon in said selected region being changed into at least a portion of said field oxide isolation region and further resulting in said polysilicon buffer layer being transformed into a plurality of polysilicon islands.

20. The method of claim 19, wherein said step of removing said masking stack from said semiconductor wafer comprises etching said nitride layer and said pad oxide layer, and wherein said plurality of polysilicon islands prevents etching active areas of said semiconductor wafer.

21. The method of claim 20, wherein said step of transforming said islands comprises oxidizing said polysilicon islands.

22. The method of claim 21, wherein said step of removing a portion of said second material comprises removing said oxidized polysilicon islands to expose said active areas.

23. A method of reducing stress in a field oxide isolation process comprising:

providing a silicon wafer having a first side;

forming a polysilicon buffer layer directly on said first side of said silicon wafer;

forming a masking stack on said polysilicon buffer layer by depositing a pad oxide layer and a masking material on said pad oxide layer;

selectively removing a portion of said masking stack to expose a selected region of said polysilicon buffer layer;

forming an isolation region of an isolation material in said selected region of said polysilicon buffer layer, said isolation region extending into said semiconductor wafer wherein said formation of said isolation region transforms said selected region of said polysilicon buffer layer into said isolation material; and removing remaining portions of said polysilicon buffer layer by transforming said remaining portions of said polysilicon layer into said isolation material and subsequently etching said transformed portions of said polysilicon layer.

24. The method of claim 23, wherein the step of forming a masking stack on said polysilicon buffer layer comprises the steps of:

forming a pad oxide layer on top of said polysilicon buffer layer; and forming a nitride layer on top of said pad oxide layer.

25. The method of claim 24, wherein said step of selectively removing a portion of said masking stack comprises patterning and etching said nitride layer and said pad oxide layer.

26. The method of claim 25, wherein the step of forming said isolation region comprises growing a field oxide in said polysilicon buffer layer, said field oxide extending into said semiconductor wafer.

* * * * *